United States Patent
Roohparvar

[19]

[11] Patent Number: 5,959,485
[45] Date of Patent: *Sep. 28, 1999

[54] CONTROLLABLE ONE-SHOT CIRCUIT AND METHOD FOR CONTROLLING OPERATION OF MEMORY CIRCUIT USING SAME

[75] Inventor: Frankie Roohparvar, Cupertino, Calif.

[73] Assignee: Micron Technology, Inc., Boise, Id.

[ * ] Notice: This patent is subject to a terminal disclaimer.

[21] Appl. No.: 08/989,317

[22] Filed: Dec. 12, 1997

Related U.S. Application Data

[63] Continuation of application No. 08/677,810, Jul. 10, 1996, Pat. No. 5,729,169.

[51] Int. Cl.$^6$ .................................................. H03K 3/033
[52] U.S. Cl. ........................ 327/227; 327/174; 327/176
[58] Field of Search .................................. 327/254–259, 327/173, 174, 176, 227, 230

[56] References Cited

U.S. PATENT DOCUMENTS

| | | | |
|---|---|---|---|
| 4,236,253 | 11/1980 | Onishi et al. | 327/227 |
| 4,797,585 | 1/1989 | Segawa et al. | 327/176 |
| 5,309,034 | 5/1994 | Ishibashi | 327/174 |
| 5,365,181 | 11/1994 | Mair | 327/116 |
| 5,453,707 | 9/1995 | Hiratsuka et al. | 327/259 |

FOREIGN PATENT DOCUMENTS 590910   4/1993   Japan ...................................... 327/227

*Primary Examiner*—Tuan T. Lam
*Attorney, Agent, or Firm*—Schwegman, Lundberg, Woessner & Kluth P.A.

[57] ABSTRACT

A controllable one-shot circuit for use in a control unit of a memory circuit, for asserting a control signal with variable (and controllable) duration in response to a trigger signal, and a state machine for controlling memory operations of a memory circuit which includes such a controllable one-shot circuit. In preferred embodiments, the one-shot and the state machine of which it is a part are implemented as parts of a single memory chip (preferably, a nonvolatile memory chip such as an integrated flash memory circuit). Other aspects of the invention are methods of operating a state machine of a memory circuit to generate control signals for use in controlling memory operations performed by the memory circuit. In preferred embodiments of such methods, the state machine is included in an integrated memory circuit and the one-shot circuit is controlled to assert a control signal with a desired duration in response to a trigger signal, thus enabling the state machine to control efficiently the duration of selected memory operations (or sub-operations of such operations) of the memory circuit.

32 Claims, 8 Drawing Sheets

CONTROLLABLE ONE-SHOT CIRCUIT AND METHOD FOR CONTROLLING OPERATION OF MEMORY CIRCUIT USING SAME

This application is a continuation of Ser. No. 08/677,810 filed Jul. 10, 1996 and now U.S. Pat. No. 5,729,169.

BACKGROUND OF THE INVENTION

1. Field of the Invention

The present invention relates to memory circuits (e.g., flash memory chips or other integrated nonvolatile memory circuits) which include a state machine for controlling performance of memory operations, and to methods of operating such a state machine to generate control signals (for controlling performance of such memory operations). In preferred embodiments, the inventive memory chip includes a state machine which includes a controllable (reconfigurable) one-shot circuit for asserting a control signal (with controllable duration) in response to a trigger signal.

2. Description of Related Art

Throughout the specification, including in the claims, the term "connected" is used (in the context of an electronic component being "connected" to another electronic component) in a broad sense to denote that the components are electrically or electromagnetically coupled with sufficient strength under the circumstances. It is not used in a narrow sense requiring that an electrically conducting element is physically connected between the two components.

Nonvolatile memory chips (integrated circuits) are becoming increasingly commercially important. A typical nonvolatile memory chip includes an array of nonvolatile memory cells, each cell comprising a transistor having a floating gate capable of semipermanent charge storage. The current drawn by each cell depends on the amount of charge stored on the corresponding floating gate. Thus, the charge stored on each floating gate determines a data value that is stored "semipermanently" in the corresponding cell.

One particularly useful type of nonvolatile memory chip includes an array of flash memory cells, with each cell comprising a flash memory device (a transistor). The charge stored on the floating gate of each flash memory device (and thus the data value stored by each cell) is erasable by appropriately changing the voltage applied to the gate and source (in a well known manner).

FIG. 1 is a simplified block diagram of a conventional nonvolatile memory chip. Integrated circuit 3 of FIG. 1 includes at least one I/O pad 30 (for asserting output data to an external device or receiving input data from an external device), input/output buffer circuit 10 for I/O pad 30, address buffers AO through Ap for receiving memory address bits from an external device, row decoder circuit (X address decoder) 12, column multiplexer circuit (Y multiplexer) 14, and memory array 16 (comprising columns of nonvolatile memory cells, such as column 16A). Each of address buffers AO through Ap includes an address bit pad for receiving (from an external device) a different one of address bit signals X0 through Xn and Y0 through Ym.

I/O buffer circuit 10 includes a "write" branch and a "read" branch. The write branch comprises input buffer 18. The read branch comprises sense amplifier 19 and output buffer 20. Chip 3 executes a write operation by receiving data (to be written to memory array 16) from an external device at I/O pad 30, buffering the data in the write branch, and then writing the data to the appropriate memory cell. Chip 3 can also be controlled to execute a read operation in which it amplifies and buffers data (that has been read from array 16) in the read branch, and then assert this data to I/O pad 30.

Although only one I/O pad (pad 30) is shown in FIG. 1, typical implementations of the FIG. 1 circuit include a plurality of I/O pads, and each I/O pad is buffered by an I/O buffer circuit similar or identical to circuit 10. For example, one implementation of the FIG. 1 circuit includes eight I/O pads, eight buffer circuits identical to circuit 10, one line connected between the output of the output buffer 20 of each buffer circuit and one of the I/O pads (so that eight data bits can be read in parallel from buffers 20 to the pads), and one line connected between the input of the input buffer 18 of each buffer circuit and one of the I/O pads (so that eight data bits can be written in parallel from the pads to buffers 18). Each I/O pad (including I/O pad 30) typically has high impedance when the output buffer is not enabled.

Each of the cells (storage locations) of memory array circuit 16 is indexed by a row index (an "X" index determined by decoder circuit 12) and a column index (a "Y" index output determined by decoder circuit 14). Each column of cells of memory array 16 (e.g., column 16A of FIG. 1) preferably comprises "n" memory cells, each cell implemented by a floating-gate N-channel transistor. The drain of each transistor is connected to a common bitline, and the gate of each is connected to a different wordline. The source of each of transistor is held at a source potential (which is usually ground potential for the chip during a read or programming operation).

In the case that each memory cell is a nonvolatile memory cell, each of the transistors has a floating gate capable of semipermanent charge storage. The current drawn by each cell (i.e., by each of the transistors) depends on the amount of charge stored on the corresponding floating gate. Thus, the charge stored on each floating gate determines a data value that is stored "semipermanently" in the corresponding cell.

In response to address bits Y0–Ym, circuit 14 (of FIG. 1) determines a column address which selects one of the columns of memory cells of array 16 (connecting the bitline of the selected column to Node 1 of FIG. 1), and in response to address bits X0–Xn, circuit 12 (of FIG. 1) determines a row address which selects one cell in the selected column. To read the data value stored in the selected cell, a signal (a current signal) indicative of such value is provided from the cell's drain, through the cell's bitline and circuit 14, to node 1 of FIG. 1. To write a data value to the selected cell, a signal indicative of such value is provided to the cell's gate and drain.

More specifically, the FIG. 1 circuit executes a write operation as follows. Each of address buffers A0 through An asserts one of bits X0–Xn to decoder circuit 12, and each of address buffers An+1 through Ap asserts one of bits Y0–Ym to multiplexer circuit 14. In response to these address bits, circuit 14 determines a column address (which selects one of the columns of memory cells of array 16, such as column 16A), and circuit 12 determines a row address (which selects one cell in the selected column). In response to a write command (which can be supplied from control unit 29, or other circuitry to be described below), a signal (indicative of data) present at the output of input buffer 18 is asserted through circuit 14 to the cell of array 16 determined by the row and column address (e.g., to the drain of such cell). During such write operation, output buffer 20 may be disabled. A data latch (not shown) is typically provided between input buffer 18 and I/O pad 30 for storing data (to be written to a memory cell) received from I/O pad 30. When the latched data is sent to input buffer 18, input buffer 18 produces a voltage at Node 1 which is applied to the selected memory cell. Input buffer 18 is typically implemented as a tri-statable driver having an output which can be placed in a high impedance mode (and thus disabled) during a read operation. In some implementations, the functions of the latch and input buffer 18 are combined into a single device.

The FIG. 1 circuit executes a read operation as follows. Each of address buffers A0 through An asserts one of bits X0–Xn to address decoder circuit 12, and each of address buffers An+1 through Ap asserts one of bits Y0–Ym to address decoder circuit 14. In response to these address bits, circuit 14 asserts a column address to memory array 16 (which selects one of the columns of memory cells, such as column 16A), and circuit 12 asserts a row address to memory array 16 (which selects one cell in the selected column). In response to a read command (supplied from control unit 29, or from other circuitry to be described below), a current signal indicative of a data value stored in the cell of array 16 (a "data signal") determined by the row and column address is supplied from the drain of the selected cell through the bitline of the selected cell and then through circuit 14 to sense amplifier 19. This data signal is processed in amplifier 19 (in a manner to be described below), and the output of amplifier 19 is buffered in output buffer 20 and finally asserted at I/O pad 30.

When reading a selected cell of array 16, if the cell is in an erased state, the cell will conduct a first current which is converted to a first voltage in sense amplifier 19. If the cell is in a programmed state, it will conduct a second current which is converted to a second voltage in sense amplifier 19. Sense amplifier 19 determines the state of the cell (i.e., whether it is programmed or erased corresponding to a binary value of 1 or 0, respectively) by comparing the voltage indicative of the cell state to a reference voltage. The outcome of this comparison is an output which is either high or low (corresponding to a digital value of one or zero) which sense amplifier 19 sends to output buffer 20, which in turn asserts a corresponding data signal to I/O pad 30 (from which it can accessed by an external device.

Nonvolatile memory chip 3 of FIG. 1 can also execute an erase operation in which all or selected ones of the cells of memory array 16 are erased in response to a sequence of one or more commands (e.g., an "Erase Setup" command followed by an "Erase Confirm" command)), by discharging a quantity of charge stored on the floating gate of each cell. Typically, all cells of array 16 or large blocks of such cells are erased at the same or substantially the same time during an erase operation. Each erase operation comprises a sequence of steps, including "verification" steps for verifying that the cells have desired threshold voltages at each of one or more stages of the erase operation. A verification step is also typically performed during a cell programming operation (in which a cell is programmed to have a threshold voltage different from the threshold voltage of an erased cell), to determine whether the cell has been programmed to have the desired threshold voltage.

More specifically, if cells of memory array 16 of FIG. 1 are to be erased, an "Erase Setup" command and then an "Erase Confirm" command are sent from an external device to I/O pad 30. Where each such command comprises parallel bits, the different bits are sent in parallel to I/O pad 30 and to additional I/O pads identical to I/O pad 30. The command is transferred from I/O pad 30 (or from I/O pad 30 and additional I/O pads) to input buffer 18 (or input buffer 18 and input buffers connected to the other I/O pads), and then to control unit 29. Control unit 29, which typically includes command execution logic and a state machine, processes each command to generate instruction data, and supplies the instruction data to circuit 14 and sense amplifier 19 (and to other components of memory chip 3 of FIG. 1) to cause chip 3 to execute a sequence of steps required for erasing the specified cells of array 16. These steps include verification steps (e.g., the verification step discussed below) for verifying that the cells have desired threshold voltages at each of one or more stages of the erase operation.

During each verification step, verification data output from sense amplifier 19 is fed back to control unit 29. Typically, an external device polls output pads of chip 3 in order to determine whether the erase operation has been completed and whether the erase operation was successful.

A conventional memory erase operation is next described in greater detail with reference to FIG. 2. FIG. 2 is a block diagram of a conventional flash memory system 103 which is a variation on memory chip 3 of FIG. 1 which performs essentially all the same functions as does chip 3. The components of flash memory system 103 which correspond to components of memory chip 3 of FIG. 1 are identified by the same reference numerals as in FIG. 1. Memory array 16 of system 103 consists of flash memory cells arranged in rows and columns with there being a total of 256K of eight bit words in the array. The individual cells (not depicted) are addressed by eighteen address bits (A0–A17), with nine bits being used by X decoder circuit 12 to select the row of array 16 in which the target cell is located and the remaining nine bits being used by Y decoder circuit 14A (of Y-multiplexer 14) to select the appropriate column of array 16.

Internal state machine 120 of memory system 103 controls detailed operations of system 103 such as the various individual steps necessary for carrying out programming, reading and erasing operations. Each of these primary operations is comprised of a large number of sub-operations. In addition, state machine 120 controls such operations as reading or clearing status register 126, identifying chip 103 in response to an identification command, and suspending an erase operation. State machine 120 functions to reduce the overhead required of the external processor (not depicted) typically used in association with chip 103.

A preferred implementation of a state machine for use as state machine 120 of FIG. 2 is described in U.S. Pat. No. 5,629,644, issued on May 13, 1997. This preferred state machine implementation (shown in FIG. 3) includes a single circuit which controls several different memory operations (e.g., programming and erasing operations) and sub-operations, where at least one of the sub-operations is common to two or more of the memory operations. As shown in FIG. 3, the state machine includes sequencer module 210 which operates in response to high level operation command signals (such as signals 211 and 212) generated by a device external to chip 103. Each command signal is typically an instruction to carry out a block erase operation on the memory cells of an array or a programming operation on a specified memory cell.

Command signals 211 and 212 cause sequencer 210 to produce output signals which control the operation of loop controller module 220, timer module 230, pulse counter module 240, and address counter module 250. These modules are used to execute the erase or programming operation by controlling the order and manner in which various sub-operations used in those operations are performed.

The outputs of sequencer 210 are control signals including a sequence start signal 215 that initiates loop controller circuit 220 and a control signal corresponding to the operation or sub-operation to be executed. These operations and sub-operations include internal programming operation 216, pre-programming operation 217, internal erase operation 218, and healing operation 219, where the pre-program, internal erase, and healing operations are part of an erase operation. The control signal(s) corresponding to the operation or sub-operation to be executed are also provided to timer module 230, pulse counter module 240, and address counter module 250.

Loop controller 220 is activated by sequence start signal 215 issued by sequencer 210. Loop controller 220 contains circuitry which responds to the sequence start signal and the control signal (e.g., 216, 217, 218, or 219) indicating which operation or sub-operation is to be executed, by generating the control signals 222 needed to cause the high voltage pulse generator circuits to produce a desired voltage pulse for programming or erasing a cell. Loop controller 220 also generates control signals 223 as needed for controlling the chip's sense amplifiers (e.g., those within unit 100 of FIG. 2) during the indicated operation or sub-operation.

Timer module 230 contains circuitry which produces an output pulse of variable duration. A description of timing circuitry suitable for use in timer module 230 is found in U.S. patent application Ser. No. 08/509,035, entitled "Adjustable Timer Circuit", filed on Jul. 28, 1995, which is incorporated herein in full by reference. Timer module 230 receives start signal 226 from loop controller 220 which initiates the timing circuitry. Start signal 226 causes the timing circuitry to initiate a timing sequence of duration determined by which control signal (216, 217, 218, or 219) is active. At the conclusion of the specified time period, timer module 230 outputs an end signal 227 to loop controller 220. End signal 227 causes loop controller 220 to terminate the operation or sub-operation whose execution it is controlling, and initiate a new operation.

The control signals output by sequencer 210 are also provided to pulse counter module 240. Pulse counter module 240 also receives increment pulse counter signal 225 from loop controller 220. The control signals from sequencer 210 set pulse counter 240 to the appropriate value based on the operation or sub-operation to be executed. During execution of the operation or sub-operation, loop controller 220 outputs "Increment Pulse Counter" signal 225 as required in accordance with the stage of execution of an operation. When the maximum pulse counter value (determined by the input signal(s) from sequencer 210) has been reached, pulse counter module 240 outputs a maximum pulse counter signal 228 which is used to terminate a program or erase operation.

Reset signal 261 is provided to all elements of state 120. Maximum pulse counter signal 228 can trigger assertion of reset signal 261, which will end the operation being executed (e.g., to prevent endless cycling of the state machine through the operation).

The control signals output by sequencer 210 are also provided to address counter module 250, and module 250 also receives increment address counter signal 224 from loop controller 220. The control signals from sequencer 210 set the address counter to the appropriate value based on the operation or sub-operation to be executed. Address counter module 250 includes an address counter/incrementer module and a combinational logic module which operate to produce the memory cell addresses output on address bus 231 and maximum address ("MaxAdd") signal 229. During execution of an operation or sub-operation, loop controller 220 outputs "increment address counter" signal 224 as required in accordance with the stage of execution of the operation (or sub-operation). When the maximum address counter value (determined by the input signal or signals received at module 250 from sequencer 210) has been reached, address counter module 250 asserts maximum address signal 229 to loop control module 220 and sequencer 210 to indicate that the operation or sub-operation has been completed.

Another use of the increment pulse counter signal and increment address counter signal is as part of a control scheme for terminating an operation. By appropriately setting the maximum address and pulse counter values, the increment counter signals can be used to increment the counters to those maximum values after a single cycle (or any desired number of cycles). This allows execution of only part of the sequence of operations that would normally occur, and is part of the control scheme that allows using the same functional modules for executing the high level operations.

With reference again to FIG. 2, if memory array 16 is to be erased (typically, all or large blocks of cells are erased at the same time), an external processor causes the Output Enable $\overline{OE}$ pin to be inactive (high) and the Chip Enable $\overline{CE}$ and Write Enable $\overline{WE}$ pins to be active (low). The processor can then issue an 8 bit command 20H (0010 0000) on data I/O pins DQ0–DQ7, typically called an Erase Setup command (one of I/O pins DQ0–DQ7 corresponds to I/O pad 30 of FIG. 1). This is followed by issuance of a second eight bit command DOH (1101 0000), typically called an Erase Confirm command. Two separate commands are used so as to minimize the possibility of an inadvertent erase operation.

The commands are transferred to data input buffer 122 (input buffer 18 of FIG. 1 corresponds to a component of buffer 122 which receives one bit of each command) and the commands are then transferred to command execution logic unit 124. Logic unit 124 then instructs state machine 120 to control chip 103's performance of a sequence of steps for erasing array 16. Once the erase sequence is completed, state machine 120 updates 8-bit status register 126, the contents of which are transferred to data output buffer 128 which is connected to data I/O pins DQ0–DQ7 of chip 103 (output buffer 18 of FIG. 1 corresponds to a component of buffer 128 which receives one bit from register 126). The processor periodically polls the data I/O pins to read the contents of status register 126 in order to determine whether the erase sequence has been completed and whether it has been completed successfully.

U.S. patent application Ser. No. 08/507,160 (filed on Jul. 26, 1995 and assigned to the assignee of the present application) describes in detail a typical erase sequence as it is carried out by state machine 120.

During any erase operation, it is possible that one or more cells of array 16 will become "overerased" in the sense that the net charge on the floating gate of each such cell becomes positive and the threshold voltage of each such cell becomes negative. When the word line connected to an overerased deselected cell is grounded, the deselected cell will nevertheless conduct current. This current will interfere with the reading of the selected cell thereby preventing proper memory operation. A principal objective of a preferred erase sequence controlled by state machine 120 is to erase all the cells of array 16 so that their threshold voltages are all within a specified voltage range, to avoid overerasing cells. The voltage range is typically a small positive voltage range such as +1.5 to +3.0 volts. If the erased cells fall within this range, the cell to be read (the "selected" or "target") cell will produce a cell current in a read operation. The presence of cell current flow indicates that the cell is in an erased state (logic "1") rather than a programmed state (logic "0"). Cell current is produced in an erased cell because the voltage applied to the control gate of the cell, by way of the word line from the array connected to X decoder 12, exceeds the threshold voltage of the erased cell by a substantial amount. In addition, cells which are not being read ("deselected" cells) are prevented from producing a cell current even if such cells have been erased to a low threshold voltage state. By way of example, cells located in the same row as the selected cell share the same word line as the selected cell. However, the drains of the deselected cells will be floating thereby preventing a cell current from being generated. Deselected cells in the same column will not conduct cell current because the word lines of such deselected cells are typically grounded. Thus, the gate-source voltage of these cells will be insufficient to turn on these deselected cells even if they are in an erased state.

Once array 16 has been erased, the vast majority of its cells will have a proper erased threshold voltage. However, it is possible that a few (or even one) of the cells may have responded differently to the erase sequence and such cell(s) have become overerased.

In a preferred erase sequence controlled by state machine 120, when the two above-mentioned erase commands have been received by command execution logic 124 (shown in FIG. 2), state machine 120 first causes all cells of array 16 to be programmed. This is done so that all cells are in essentially the same condition when they are subsequently erased. This reduces the likelihood that one or more of the cells will become overerased since all of the cells will have an increased tendency to respond to the subsequent erase sequence in the same manner. Then, an address counter (address counter module 250 which is a portion of state machine 120 of FIG. 2) is initialized to the first address of the memory. Next, the voltages used for programming are set to the proper level (including by providing a high voltage Vpp from Vpp switch 121 of FIG. 2 to status register 126, X and Y decoders 12 and 14A, and other components of FIG. 2).

Once the voltages are set, pulse counter module 240 within state machine 120 is initialized. This module will keep track of the number of programming pulses that have been applied to the cells of the word (byte) being programmed. Next, a programming pulse is applied to the cells of the word located at the first address of the memory. The pulse counter is then incremented and a determination is made as to whether a predetermined maximum number of pulses have been applied to the cells. If that is the case, the cells are read to determine whether the cells have, in fact, been programmed (this is a "verification" operation). The verification operation is accomplished using sense amplifiers and associated components represented by block 100 of FIG. 2.

If the cells are still not programmed at this point, there has been a failure since he maximum number of programming pulses has been exceeded. Depending upon the particular memory, the sequence will be terminated or a record of the failed word will be made and the sequence continued. This information will then be transferred to status register 126 (FIG. 2) so that it can be read by an external processor.

Assuming that the maximum count has not been exceeded, the byte is verified. If the byte has not been programmed, a further programming pulse is applied and the counter is incremented. Assuming that the maximum count has still not been exceeded, the byte is again verified. This sequence continues until the byte finally passes the verification test or until the pulse counter is at the maximum.

Assuming that the first byte is eventually successfully programmed, a determination is made as to whether the last address of array 16 has been programmed. If that is not the case, address counter 250 (of FIG. 2) is incremented to the second address and the pulse counter reset. A first programming pulse is applied to the byte of the second address and the sequence is repeated. This process will continue until all cells of array 16 have either been programmed or until a determination is made that there is a programming failure.

Assuming that all of the cells have been successfully programmed and verified, state machine 120 will continue the erase sequence by setting the appropriate voltages used for erasing, including the initialization of the address counter 250 and the setup of the appropriate voltages for erasing, including voltage Vpp.

Next, the pulse counter is reset and a single erase pulse is applied to all of the cells of array 16 (or to the block of the array being erased in the event that capability is provided). The cells of array 16 will then be sequentially read (an "erase verification" test) in order to determine whether all cells have been successfully erased. A single erase pulse is almost never sufficient to accomplish an erasure so that the test on a first byte will almost always fail. The state of the pulse counter is then examined and a determination is made that the maximum count has not been exceeded. If it has not, a second erase pulse is applied to the entire array 16 and the first byte is again tested.

Once the byte has received a sufficient number of erase pulses and has passed the verification test, the address is incremented and a second byte is tested to determine whether the second byte has been successfully erased. Since the cells are not always uniform, it is possible that the second byte has not been erased even though it has received the same number of erase pulses received by the first byte. In that event, a further erase pulse is applied to the entire array 16 and the second byte is again tested for a proper erase.

Once it has been established that the second byte has been properly erased, a determination is made as to whether the last address of array 16 has been verified. If that is not the case, address counter 250 is incremented and a third byte is tested. Additional erase pulses will be applied if necessary. The pulse counter will monitor the total number of erase pulses applied in the erase sequence. If a maximum number has been exceeded, the sequence will be terminated and one of the bits of status register 126 will be set to reflect that an erase error has occurred.

Assuming that the second byte of cells has been properly erased, the remaining bytes will be verified and any necessary additional erase pulses will be applied. Once the last address has been verified, the erase sequence is ended and status register 126 is updated to indicate that the erase sequence has been successfully completed.

Before the present invention, state machines for controlling memory operations of a memory chip had used complicated timing circuits (e.g., timer module 230 of FIG. 3, including the complicated timing circuitry described in referenced U.S. patent application Ser. No. 08/509,035) to produce control signals with variable timing. For example, during different memory operations, the state machine of FIG. 3 controls timer 230 to assert end signal 227 at different times after assertion of start signal 226. Not only were such timing circuits complicated, but they typically operated to delay assertion of control signals for long time intervals (e.g., on the order of tens of milliseconds or one second), and were not capable of precisely controlling (e.g., to within a few tens of nanoseconds or even a few hundreds of nanoseconds) the delay interval preceding assertion of such a control signal.

Before the present invention, state machines for controlling memory operations of a memory chip had used one-shot circuits to assert control signals with short delay (e.g., tens or hundreds of nanoseconds). For example, loop control module 220 (shown in FIG. 3) of the state machine of referenced U.S. patent application Ser. No. 08/508,974 preferably includes several one-shot circuits, each for asserting a delayed control signal in response to an input control signal (or logical combination of input control signals). However, each such one-shot circuit had operated with a fixed delay between a trigger signal edge and the delayed output signal produced in response to the trigger signal edge (e.g., one such one-shot asserted an output pulse whose leading edge always occurred 500 nanoseconds after assertion of a trigger signal edge to the one-shot).

Until the present invention, state machines for controlling memory operations of a memory chip had not employed a simple but controllable one-shot circuit for asserting a delayed control signal with variable (and controllable) delay in response to a trigger signal edge.

SUMMARY OF THE INVENTION

A preferred embodiment of the invention is a controllable (reconfigurable) one-shot circuit (for use in a control unit of a memory circuit) which asserts a control signal with variable (and controllable) duration in response to a trigger signal. Typically the trigger signal is a level transition or "trigger edge" of an input signal. Preferably, the one-shot circuit asserts a pulse whose leading edge occurs a short (non-delayed) time after assertion of the trigger signal and whose trailing edge is delayed by the controllable duration after assertion of the trigger signal. Another preferred embodiment of the invention is a state machine for controlling memory operations of a memory circuit, where the state machine includes a controllable one-shot circuit for asserting a control signal with variable (and controllable) duration in response to a trigger signal. Because it includes such a controllable one-shot circuit, the state machine can efficiently control the duration of a memory operation (or a sub-operation thereof) of the memory circuit while also having a compact design (in some embodiments, the controllable one-shot circuit can replace a conventional timer circuit within the state machine). Where the control signal is a pulse having well defined leading and trailing edges, the controllable duration of the control signal is the delay between the leading and trailing edges. Preferred embodiments of the controllable one-shot circuit allow precise variation of the duration of the control signal within a short range (e.g. of length on the order of ten nanoseconds or one microsecond). It may be desirable for a state machine to employ a conventional timer circuit (in addition to or instead of the controllable one-shot of the invention) to vary the duration of operations (or sub-operations) where precise variation is not required or where the duration must vary over a relatively long time interval (e.g., an interval of length on the order of hundreds of microseconds or more).

Preferably, both the controllable one-shot and the state machine of which it is a part are implemented as portions of a single memory chip (e.g., an integrated flash memory circuit or other nonvolatile memory chip).

Another aspect of the invention is a method of operating a state machine of a memory circuit to generate control signals for controlling one or more memory operations or sub-operations performed by the memory circuit, where the state machine includes a controllable one-shot circuit and the method includes the step of controlling the one-shot circuit to assert a control signal with a desired duration in response to a trigger signal. Typically, the trigger signal is a level transition (or "trigger edge") of an input signal. Preferably, the method includes the step of controlling the one-shot circuit to assert a pulse whose leading edge occurs a short (non-delayed) time after assertion of the trigger signal and whose trailing edge is delayed by the desired duration after assertion of the trigger signal. In preferred embodiments, the state machine is included in a memory chip and the method includes the step of controlling the one-shot circuit to assert a control signal with a desired duration in response to a trigger signal during at least one memory operation (or a sub-operation of such operation) of the memory chip.

DETAILED DESCRIPTION OF THE INVENTION

Figure 1:
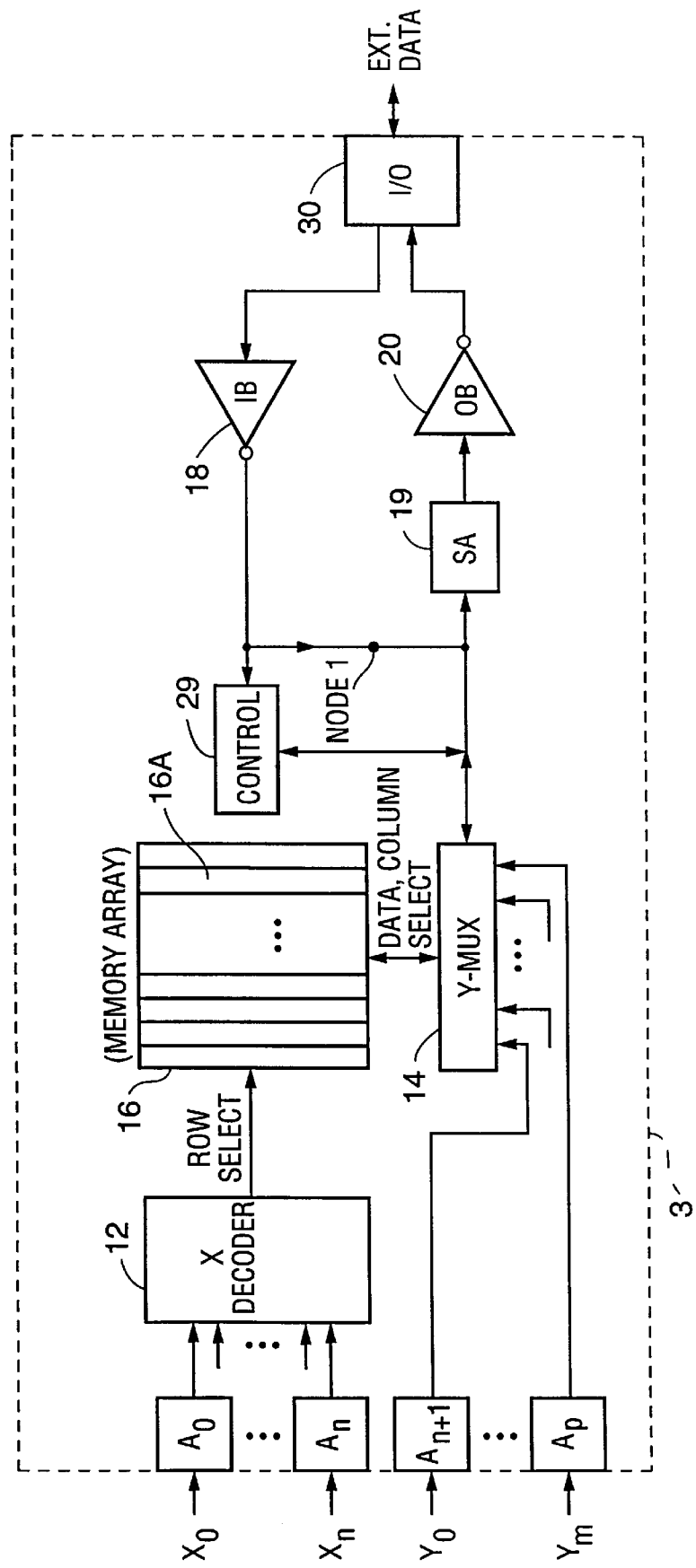
FIG. 1 is block diagram of a conventional memory circuit (implemented as an integrated circuit), including conventional means for verifying sense amplifier output.

In the following description, a signal is said to be "low" (or at a "low" level) if its level is indicative of a logical "zero," and a signal is said to be "high" (or at a "high" level) if its level is indicative of a logical "one." Thus, the output of each NAND gate discussed below is "low" only if all inputs to the NAND gate are "high."

A preferred embodiment of the one-shot circuit of the invention will be described with reference to FIG. 4. This circuit comprises inverters I1, I2, I3, and I4, NAND gates NAND1 and NAND2, capacitors CAP1 and CAP2, N-channel MOS transistors N1 and N2, and P-channel MOS transistors P1, P2, P3, P4, P5, and P6 connected as shown. The "Output" signal of the FIG. 4 circuit (the output of inverter I4) is normally at a low level, but undergoes a low-to-high transition when triggered (by a high-to-low transition of the "Trigger" signal at a time when the "Enable" signal has a high level). In response to a high-tolow transition of the "Trigger" signal, inverters I1, I2, and I3 function as a delay stage to cause a delayed high-to-low transition at the output of final inverter I3, thus forcing a high-to-low transition of the Output signal. The delayed high-to-low transition occurs at the output of I3 after a delay period of duration determined by the level of the control signal identified as "LongDelay."

More specifically, when Enable is low, Node 1 is high, so that "Output" (the output of inverter I4) is low. Before the circuit is enabled (by asserting Enable with a high level), "Trigger" is asserted with a high level, to cause Node 2 to go low (which in turn causes the output of inverter I1 to go high, switching on transistor N1 to allow capacitor CAP1 to discharge to ground through N1, and forcing the output of I2 to go high when CAP1 has discharged sufficiently). When the output of I2 goes high, transistor N2 switches on to allow capacitor CAP2 to discharge to ground through N2, thus forcing the output of I3 to go high when CAP2 has discharged sufficiently (when the voltage at Node 5 falls sufficiently low enough to cause the output of inverter I3 to go high). Since the output of I3 (Node 3) is connected to the third input of NAND2, when CAP2 has discharged sufficiently so that Node 3 is high, the third input of NAND2 is held at a high level. The circuit is therefore enabled by a low-to-high transition of Enable while "Trigger" remains high. When the circuit is enabled: Node 2 (the first input to NAND2) remains low; the second input to NAND2 (which receives "Enable") is high; and the third input to NAND2 (Node 3) is high. Thus, when the circuit is enabled, Node 1 remains high and "Output" remains low.

The "Trigger" signal need not remain high for a long time in order to put the circuit in an enabled state. NAND1 and NAND2 are designed in such a way that they cause the voltage at the input of inverter I2 (Node 6) and the voltage at the input of inverter I3 (Node 5) to move rapidly, and hence "Trigger" need remain high only a short time in order to put the circuit in an enabled state.

While in the enabled state, the circuit is triggered by a high-to-low transition of "Trigger." In response, Node 2 (the output of NAND1) rapidly goes high, the output of inverter I1 rapidly goes low, and the output of NAND2 (Node 1) rapidly goes low (since all three of the inputs of NAND2 are high). Because Node 1 rapidly goes low, the "Output" signal (the output of inverter I4) undergoes a sharp low-to-high transition.

We next describe operation of the delay stage (comprising inverters I1, I2, and I3 and capacitors CAP1 and CAP2) in the case that control signal "LongDelay" is high (so that transistors P3 and P6 are off) when the circuit is triggered. Later, we explain operation of the delay stage when it is triggered with "LongDelay" at a low level.

In response to the output of inverter I1 rapidly going low (upon triggering of the FIG. 4 circuit with "LongDelay" held high), transistor N1 switches off and transistors P1 and P2 switch on. As a result, supply voltage Vcc charges capacitor CAP1 through transistors P1 and P2. After a first delay (determined by the impedance of Pi in series with the impedance of P2) in which CAP1 charges sufficiently so that the output of inverter I2 goes low, transistor N2 switches off and transistors P4 and P5 switch on. As a result, supply voltage Vcc charges capacitor CAP2 through transistors P4 and P5. After a second delay (determined by the impedance of P4 in series with the impedance of P4), CAP2 charges sufficiently so that the output of inverter I3 (Node 3) goes low. When Node 3 goes low, the output of NAND2 undergoes a low-to-high transition (since the other two inputs of NAND2 are high), and the "Output" signal undergoes a high-to-low transition. The delay between low-to-high transition and the subsequent high-to-low transition of the "Output" signal (upon triggering of the FIG. 4 circuit with "LongDelay" high) is determined by the impedance of Pi in series with that of P2 and the impedance of P4 in series with that of P5.

In response to being triggered with "LongDelay" at a low level, the FIG. 4 circuit operates as follows. Initially, the "Output" signal undergoes a rapid low-to-high transition (just as occurs when the circuit is triggered, by a high-to-low transition of the "Trigger" signal with LongDelay high) and the output of I1 rapidly goes low. In response to the output of inverter I1 going low), transistor N1 switches off and transistors P1 and P2 switch on. P3 is already on since LongDelay is low. As a result, supply voltage Vcc charges capacitor CAP1 through transistors P1, P2, and P3. After a first delay (determined by impedance Z1 in series with the impedance of P2, where Z1 is the impedance of P1 in parallel with the impedance of P3) in which CAP1 charges sufficiently so that the output of inverter I2 goes low, transistor N2 switches off and transistors P4 and P5 switch on (P6 is already on since LongDelay is low). As a result, supply voltage Vcc charges capacitor CAP2 through transistors P4, P5, and P6. After a second delay (determined by impedance Z2 in series with the impedance of P5, where Z2 is the impedance of P4 in parallel with the impedance of P6), CAP2 charges sufficiently so that the output of inverter I3 (Node 3) goes low. When Node 3 goes low, the output of NAND2 undergoes a low-to-high transition (since the other two inputs of NAND2 are high), and the "Output" signal undergoes a high-to-low transition. The delay between low-to-high transition and the subsequent high-to-low transition of the "Output" signal (upon triggering of the FIG. 4 circuit with "LongDelay" low) is determined by impedance Z1 in series with the impedance of P2 and impedance Z2 in series with the impedance of P5.

Each of transistors P3 and P6 is designed to have very low impedance (relative to the impedance of each of transistors P1, P2, P4, and P5). Thus the impedance of the circuit through which each of capacitors CAP1 and CAP2 charges is much lower when signal "LongDelay" is low than when signal "LongDelay" is high.

Figure 4:
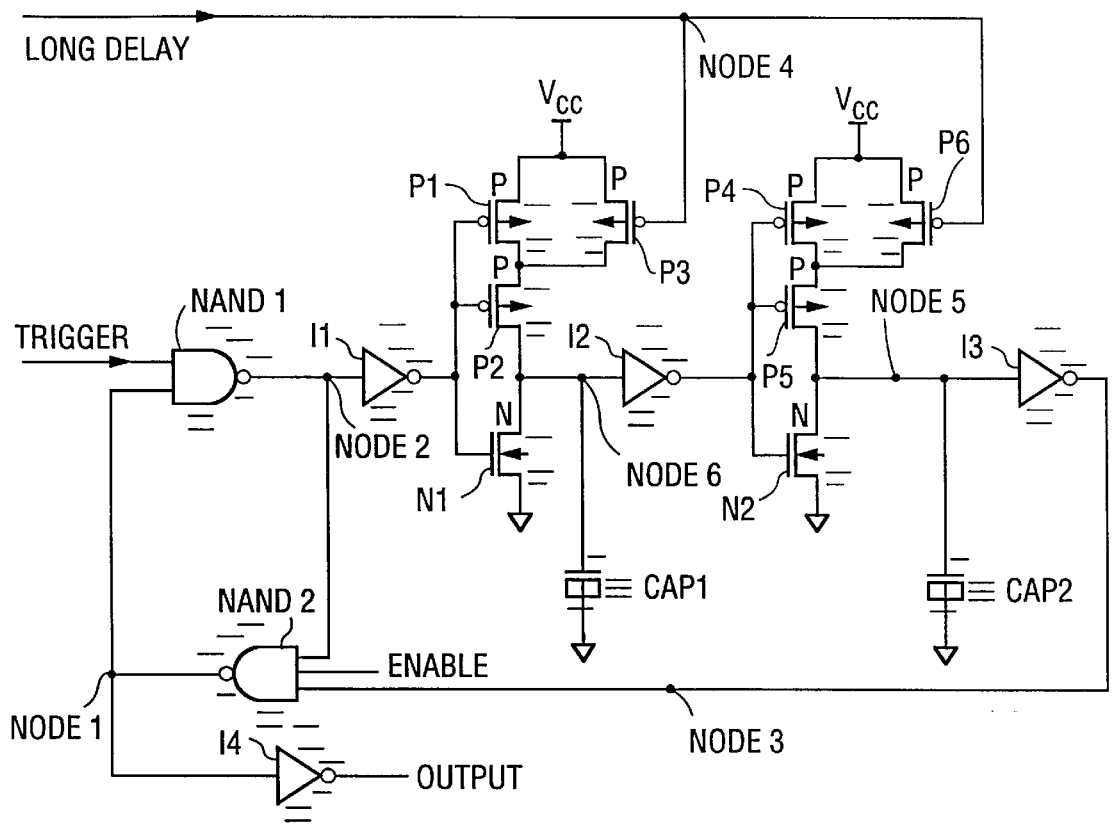
FIG. 4 is a schematic diagram of a preferred embodiment of the inventive one-shot circuit.
Figure 6:
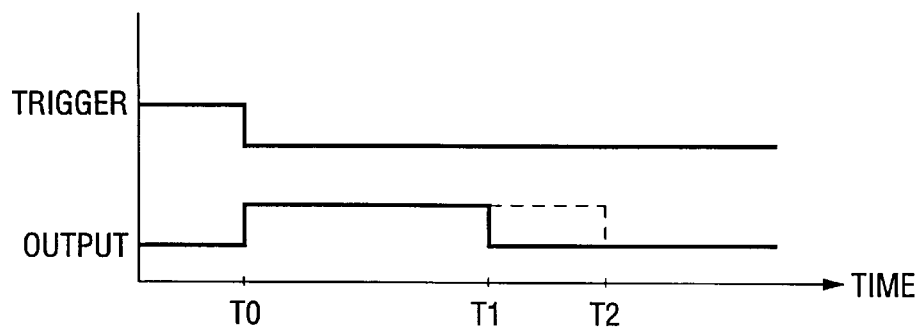
FIG. 6 is a timing diagram of various signals asserted during operation of the FIG. 4 circuit.

As shown in FIG. 6, the "Output" signal of the FIG. 4 circuit undergoes a low-to-high transition at time T0 when triggered by a high-to-low transition of the "Trigger" signal at time T0 (assuming that the "Enable" signal has been asserted with a high level prior to time T0). The delay stage of the FIG. 4 circuit then causes a high-to-low transition of the Output signal at time T1 (if control signal "LongDelay" is being asserted at Node 4 with a low level). On the other hand, if control signal "LongDelay" is being asserted at Node 4 with a high level, the delay stage of the FIG. 4 circuit delays the high-to-low transition of the Output signal until a later time T2 (as shown by the dotted lines in FIG. 6).

Thus "LongDelay" is a delay control signal whose level determines the duration of the delay between the rapid low-to-high transition of the "Output" signal (on triggering of the FIG. 4 circuit) and the following high-to-low transition of the "Output" signal. When the one-shot circuit of FIG. 4 is installed in the state machine of a memory circuit, the state machine can assert LongDelay with a first level (high or low) to the one-shot circuit during execution of a first operation (or sub-operation) to cause the one-shot circuit to operate in a first mode, and the state machine can then reconfigure the one-shot circuit by asserting LongDelay with the other level (low or high) to the one-shot circuit prior to (or during) execution of another operation (or sub-operation) to cause the one-shot circuit of FIG. 4 to operate in a second mode during the latter operation (or sub-operation).

Figure 2:
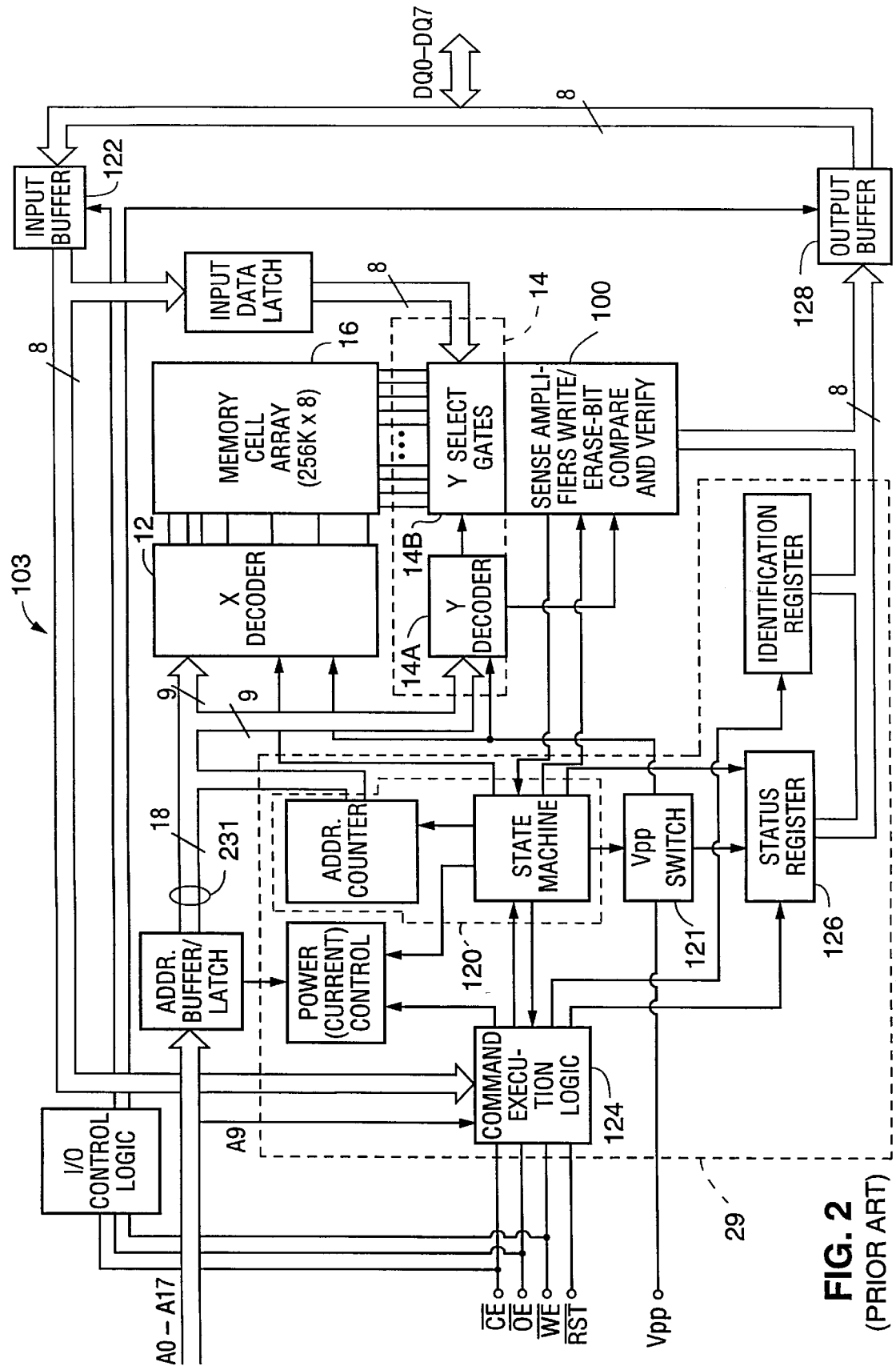
FIG. 2 is a block diagram of a conventional flash memory system.
Figure 5:
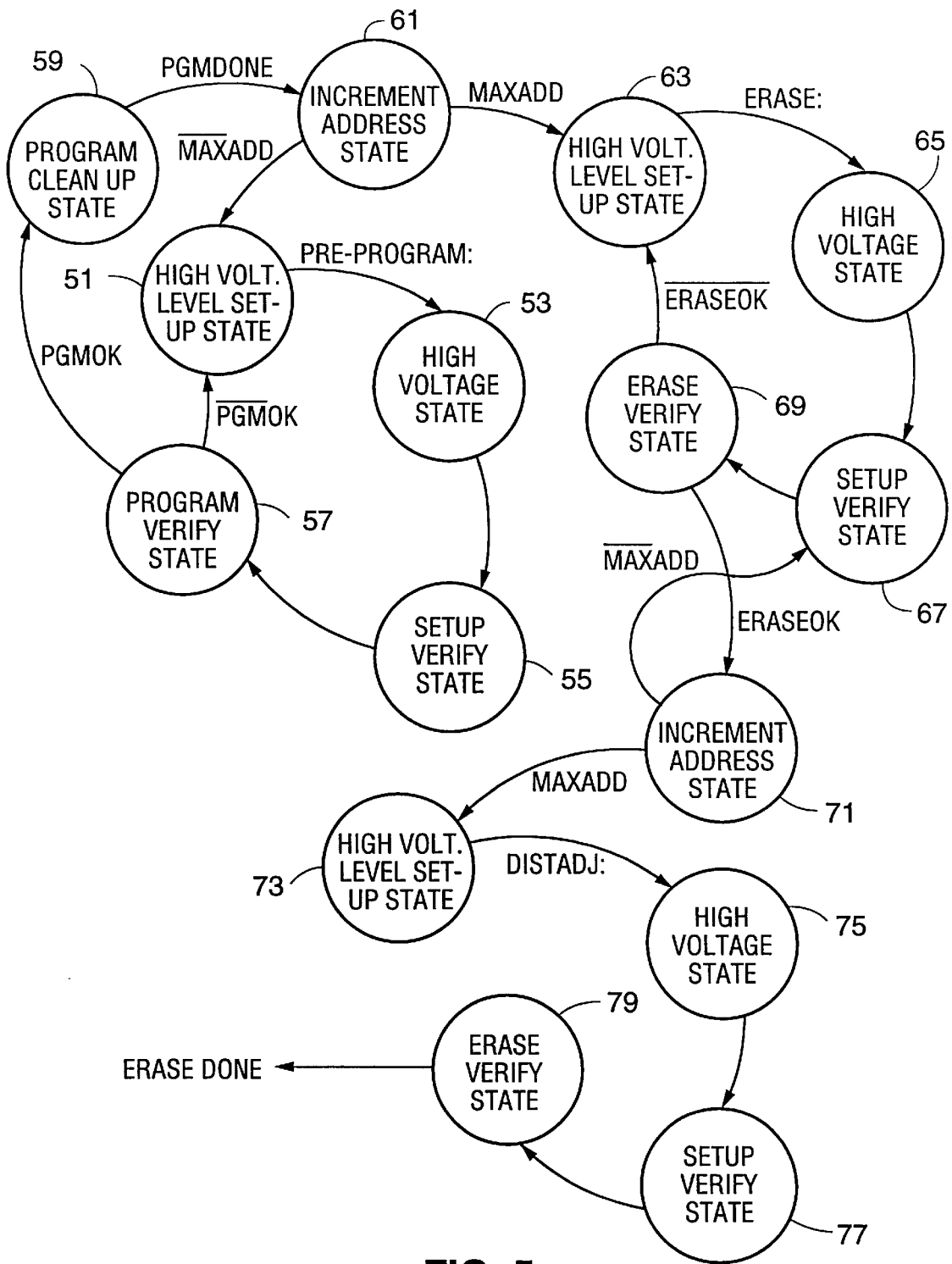
FIG. 5 is a flow chart of a data erase operation in accordance with the invention, which can be performed by an implementation of the FIG. 2 circuit which includes the state machine of FIG. 3, and the one-shot circuit of FIG. 4 included in the state machine.

With reference to FIG. 5, we next describe a memory erase method which embodies the invention, and a method for operating the one-shot circuit of FIG. 4 during performance of this erase method. The overall erase method of FIG. 5 can be implemented by chip 103 of FIG. 2 in an embodiment in which each cell of array 16 is a flash memory device, state machine 120 has the design shown in FIG. 3, and loop controller 220 of the state machine includes the one-shot circuit of FIG. 4.

The erase operation of FIG. 5 comprises a preliminary programming cycle (steps 51–61), an erase cycle (steps 63–71), and a final distribution adjustment cycle (steps 73–79).

During the programming cycle, the cells to be erased are "programmed" (i.e., an appropriate charge is stored in the gate of each cell), principally to reduce the risk of subsequent overerasing of the cells (erasing the cells into a very negative threshold). During step 51, the circuitry for applying the appropriate voltage (a high voltage) to one of the cells is enabled. Then, during step 53, the cell is "programmed" by applying the appropriate voltage to its gate and drain.

Next, a verification operation in accordance with the invention is performed to verify the status of the cell (during steps 55 and 57). Step 55 is the setup cycle of the verification operation, and step 57 includes the sample and hold cycles of the verification operation.

If step 57 of the verification operation determines that the cell is not satisfactorily programmed, steps 51, 53, 55, and 57 are repeated in sequence (to reprogram the cell and verify whether the cell is satisfactorily programmed after such reprogramming).

If step 57 of the verification operation determines that the cell is satisfactorily programmed, program clean up step 59 is performed (to ready chip 103 for erasing or programming of another cell). After step 59, cell address incrementing step 61 is performed (to selected the address of the next cell to be programmed). If step 61 determines that all cells have been programmed, then step 63 is executed. Otherwise, step 61 selects the next cell to be programmed and steps 51, 53, 55, and 57 are repeated for this new cell.

At the start of the erase cycle (after the final iteration of step 61), all the cells have been programmed. Incrementing the address at this stage resets the address counter to point to the beginning of the block. During the first step of the erase cycle (step 63), circuitry is enabled for applying the appropriate voltage (a high voltage) to all of the cells. Then, during step 65, each cell is "erased" by applying the appropriate voltage to its source and gate.

Next, a verification operation in accordance with the invention is performed to verify the status of the cell to which the address counter points (during steps 67 and 69). Step 67 is the setup cycle of the verification operation, and step 69 includes the sample and hold cycles of the verification operation.

If step 69 of the verification operation determines that the cell is not satisfactorily erased, steps 63, 65, 67, and 69 are repeated in sequence (to re-trigger another high voltage cycle thereby re-erasing all the cells, and to verify whether the cell to which the address counter points is satisfactorily erased after such re-erasing).

If step 69 of the verification operation determines that the cell to which the address counter points is satisfactorily erased, cell address incrementing step 71 is performed (to select the address of the next cell to be verified). If step 71 determines that all cells have been erased, then step 73 is executed (and a maximum cell address signal "MaxAdd" is asserted with a high logical level). Otherwise, step 71 selects the address of the next cell to be verified and steps 67 and 69 are repeated for this new cell and signal "-MaxAdd" is asserted (i.e., "MaxAdd" is asserted with a low logical level).

After the final iteration of step 71, the chip performs the distribution adjustment cycle (steps 73–79). The purpose of this cycle is to tighten the distribution of memory cell threshold voltages (e.g., to correct for overerasing of any cell during the erase cycle. During step 73, the circuitry for applying the appropriate voltage (a high voltage) to all the cells is enabled. Then, during step 75, the cells are simultaneously (or substantially simultaneously) adjusted by applying the appropriate voltage to their gates. Then, yet another verification operation in accordance with the invention is performed to verify the status of all the cells (during steps 77 and 79), to determine whether each cell is still satisfactorily erased. Step 77 is the setup cycle of the verification operation, and step 79 includes the sample and hold cycles of the verification operation.

After step 79, the chip (e.g., control unit 29 of chip 103) asserts data indicating the result of the final verification operation (e.g., to an output pad which can be accessed by an external device), and asserts a control signal ("Erase Done") indicating that the overall erase operation has been completed.

Verification setup cycle 67 includes the operations of enabling each sense amplifier to be used to verify the state of a cell during step 69 and asserting the appropriate voltages needed for performing step 69. Cycle 67 can be entered either at the end of high voltage step 65 (during which cells are erased by applying a high voltage thereto) or following an iteration of step 71. Step 71 is performed after the state of at least one cell has been verified during an iteration of step 69, to select the address of the next cell to be verified. The required duration of cycle 67 depends on whether cycle 67 follows high voltage step 65 or address selection step 71. In the former case (entry into cycle 67 immediately after step 65), the duration of cycle 67 needs to be sufficiently long (typically on the order of one microsecond) to clear up all the high voltages from all the internal nodes (this process cannot be performed too fast, since it can cause circuit problems inside the chip if performed too rapidly). In the latter case (entry into cycle 67 immediately after an iteration of step 71, when MaxAdd is low), the duration of cycle 67 can be much shorter (typically on the order of a few tens of nanoseconds).

It is required that a latch is set in response to execution of step 63, and that the latch is reset by execution of step 69 (step 69 is the sample and hold cycles of the verification operation). The output of this latch determines the level of the signal "LongDelay."

Figure 3:
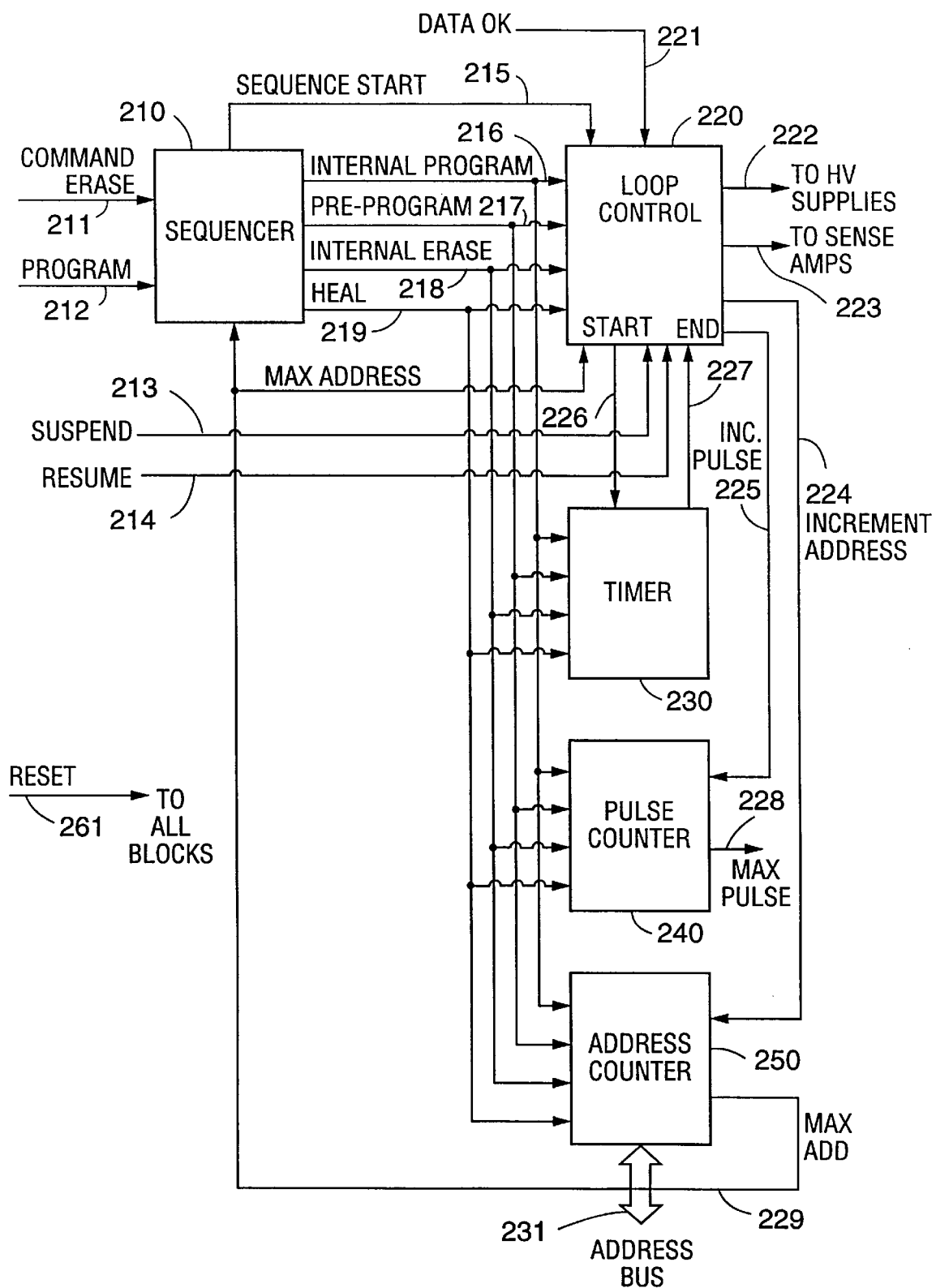
FIG. 3 is a block diagram of a preferred implementation of state machine 120 of FIG. 2, which can be modified to embody the present invention.

Thus, during performance of the inventive erase method, a one-shot circuit of the type shown in FIG. 4 (included in loop controller 220 of the state machine of FIG. 3) is operated to control the duration of cycle 67 in response to the state of above-mentioned control signal "LongDelay." More specifically, signal "LongDelay" is asserted to Node 4 of the one-shot circuit of FIG. 4 rather than signal "LongDelay," and the "Output" signal of the one-shot circuit is above-mentioned control signal 222 (discussed with reference to FIG. 3). In response to assertion of a Trigger signal (internally generated within loop controller 220), the one-shot circuit asserts the Output signal (control signal 222) with a high level for a period determined by the level (high or low) of the signal "LongDelay." If LongDelay is high, transistors P3 and P6 are off, and the duration of the high-going Output signal pulse (the high-going pulse of signal 222) is long (e.g., one microsecond, or in the range from one hundred nanoseconds to three microseconds). If LongDelay is low, transistors P3 and P6 are on, and the duration of the high-going Output signal pulse is short (e.g., on the order of a few tens of nanoseconds, or in the range from ten nanoseconds to 99 nanoseconds). The duration of the high-going Output signal pulse is substantially equal to the delay implemented by the delay stage of the one-shot circuit of FIG. 4 between assertion of a signal (a "switch" signal) at Node 2 whose inverse (at the output of I1) causes transistor N1 to commence discharging of capacitor CAP1, and assertion of a delayed signal at Node 3 which indicates that capacitor CAP2 has reached a discharged state.

Of course, the one-shot circuit of FIG. 4 can be employed for an alternative purpose within loop control unit 220 or within another element of the state machine. Or, several one-shot circuits (each having the FIG. 4 design) can be employed within the state machine, each for a different purpose.

Another embodiment of the one-shot circuit of the invention will be described with reference to FIG. 7. This circuit (which can be substituted for the FIG. 4 circuit in most applications of the invention) comprises inverters I2, I3, I4, and I10, NAND gate NAND2, capacitors CAP1 and CAP2, N-channel MOS transistors N1 and N2, and P-channel MOS transistors P1, P2, P3, P4, P5, and P6 connected as shown. The FIG. 7 embodiment differs from that of FIG. 4 in three respects: NAND gate NAND1 of FIG. 4 is not included in the FIG. 7 system; inverter I10 of FIG. 7 replaces inverter I1 of FIG. 4; and control signal "Delay" in the FIG. 7 system is a multibit signal (which replaces control signal "LongDelay" of FIG. 4, which is indicative of a single binary bit). Those elements of FIG. 7 which are numbered identically to corresponding elements of FIG. 4 are identical (and function identically) to those corresponding elements, and the description of these elements set forth above will not be repeated below.

Figure 7:
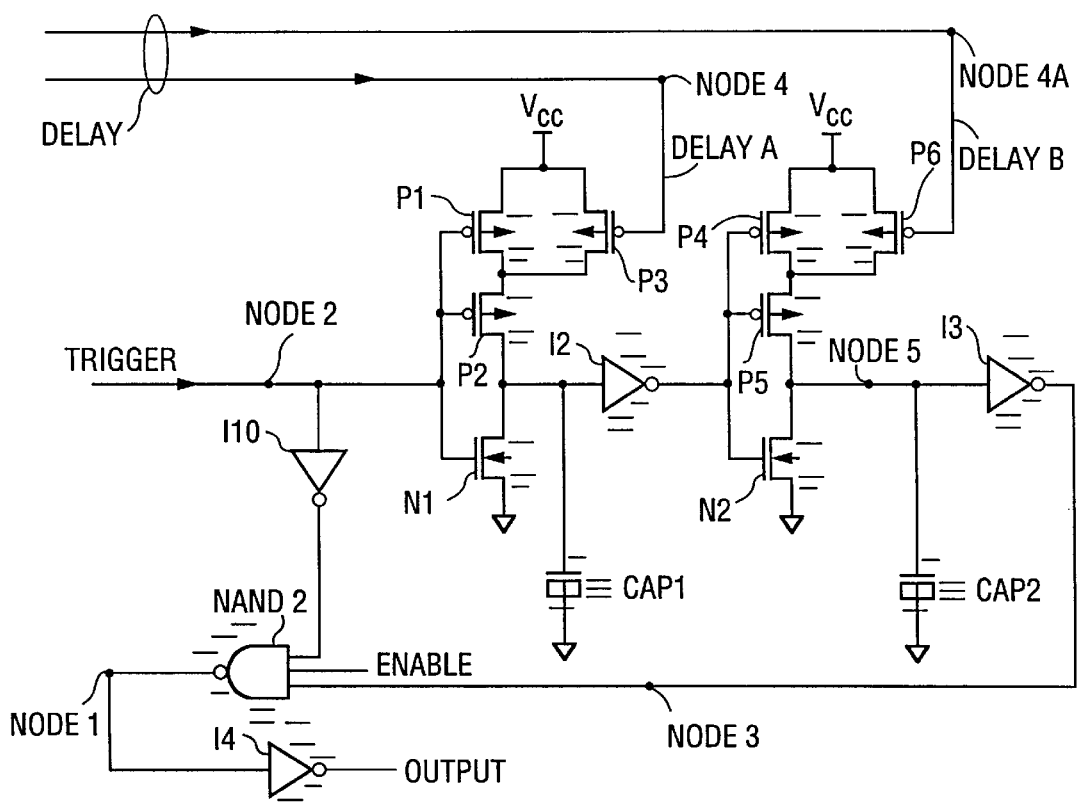
FIG. 7 is a schematic diagram of a second embodiment of the inventive one-shot circuit.

The FIG. 7 circuit is enabled by assertion of the same sequence of values of the Trigger and Enable signals as is the FIG. 4 circuit. When the FIG. 7 circuit is enabled (and high levels of Trigger and Enable are asserted thereto), the Output signal (asserted at the output of inverter I4) has a low level. The Output signal (the output of inverter I4) undergoes a rapid low-to-high transition when the FIG. 7 circuit is triggered (by a high-to-low transition of the "Trigger" signal at a time when the "Enable" signal has a high level). In response to a high-to-low transition of the "Trigger" signal, inverters I2 and I3 function as a delay stage to cause a delayed high-to-low transition at the output of final inverter I3, thus forcing a delayed high-to-low transition of the Output signal. The delayed high-to-low transition occurs at the output of I3 (and thus at the output of I4) after a delay period of duration determined by the level of the control signal identified as "Delay."

The FIG. 7 circuit is simpler than the above-described FIG. 4 circuit in that the FIG. 7 includes only gate NAND2 (and not also gate NAND1). In the FIG. 4 circuit, gate NAND1 functions to filter noise on the "Trigger" line in the following sense. After the FIG. 4 circuit has been enabled and Trigger has undergone a first high-to-low transition (so that "Output" has gone high rapidly), but before the capacitor charging delay period (determined by the level of LongDelay) has elapsed (so that "Output" has not yet fallen back to its normally low level), NAND1 prevents short duration increases of the level of Trigger (e.g., spikes due to noise) from affecting the level of "Output." Specifically, if Trigger goes high (for a short duration) with the FIG. 4 circuit in the described state, the output of NAND1 (Node 2) will remain high (i.e., the short duration high-going pulse of Trigger is suppressed) and Node 1 will remain low (Node 3 and the level of Enable will also remain high), and thus the level of Output will remain high. Only after the delay period elapses will Node 3 fall to a low level, causing Output to fall to a low level.

In contrast, when the FIG. 7 circuit has been enabled and Trigger has gone low (so that the output of inverter I10 has gone high rapidly and "Output" has gone high rapidly), but before the capacitor charging delay period (determined by the level of Delay) has elapsed (so that "Output" has not yet fallen back to its normally low level), a short duration increase of the level of "Trigger" (e.g., due to noise) will cause the level of "Output" to fall rapidly (and prematurely) to a low level. This is because the increase of the level of "Trigger" causes the output of inverter I10 to fall rapidly to a low level, thus causing the output of NAND2 to rise rapidly (and prematurely) to a high level.

Despite this sensitivity to noise on the Trigger line, the FIG. 7 circuit will be suitable for many of the applications for which the FIG. 4 circuit is suitable (and will also be suitable for additional applications for which the FIG. 4 circuit may not be optimal).

The delay period determined by the control signal "Delay" of FIG. 7 has one of four selectable values. "Delay" consists of two parallel single bit signals (DelayA and DelayB), one of which (DelayA) is asserted to the control gate of transistor P3 (Node 4), and the other of which (DelayB) is asserted to the control gate of transistor P6 (Node 4A). When the levels of DelayA and DelayB are respectively low and low, capacitors CAP1 and CAP2 will charge rapidly, and thus "Delay" determines the shortest of the four possible delay periods. When the levels of DelayA and DelayB are respectively high and high, capacitors CAP1 and CAP2 will charge slowly, and thus "Delay" determines the longest of the four possible delay periods. When the levels of DelayA and DelayB are respectively low and high, capacitor CAP1 will charge rapidly and capacitor CAP2 will charge slowly, and when the levels of DelayA and DelayB are respectively high and low, capacitor CAP1 will charge slowly and capacitor CAP2 will charge rapidly and thus these two values of "Delay" determine two intermediate delay periods (which can be different or identical, depending on the impedances of transistors P1 through P6).

The inventor envisions many variations on the inventive concept of asserting a control signal (e.g., LongDelay or Delay) to the one-shot circuit of the invention to control the delay period between the rising and falling edges of the circuit's "Output" signal. For example, in alternative embodiments of the inventive one-shot circuit, the one-shot circuit receives a control signal consisting of N single-bit signals (where N is any integer) provided in parallel over a bus having N-bit width.

Another embodiment of the one-shot circuit of the invention will be described with reference to FIG. 8. This circuit (which can be substituted for the FIG. 4 circuit in most applications of the invention) comprises inverters I3, I4, and I10, NAND gate NAND2, capacitors C1, C2, and C3, N-channel MOS transistors N10, N11, and N12, P-channel MOS transistors P10, P11, and P12, and multiplexer circuit 203 connected as shown. Transistors P10 and N10 and capacitor C1 comprise first delay branch 100, transistors P11 and N11 and capacitor C2 comprise second delay branch 101, and transistors P12 and N12 and capacitor C3 comprise third delay branch 102. In response to control signal Delay2, multiplexer circuit 203 (which is a switch) selects the output of one of branches 100, 101, and 102 and asserts the output of the selected branch to the input of inverter I3.

Elements I10, NAND2, I3, and I4 are identical to (and function in the same way as) the corresponding identically numbered elements of the FIG. 7 circuit, and the description thereof will not be repeated.

Figure 8:
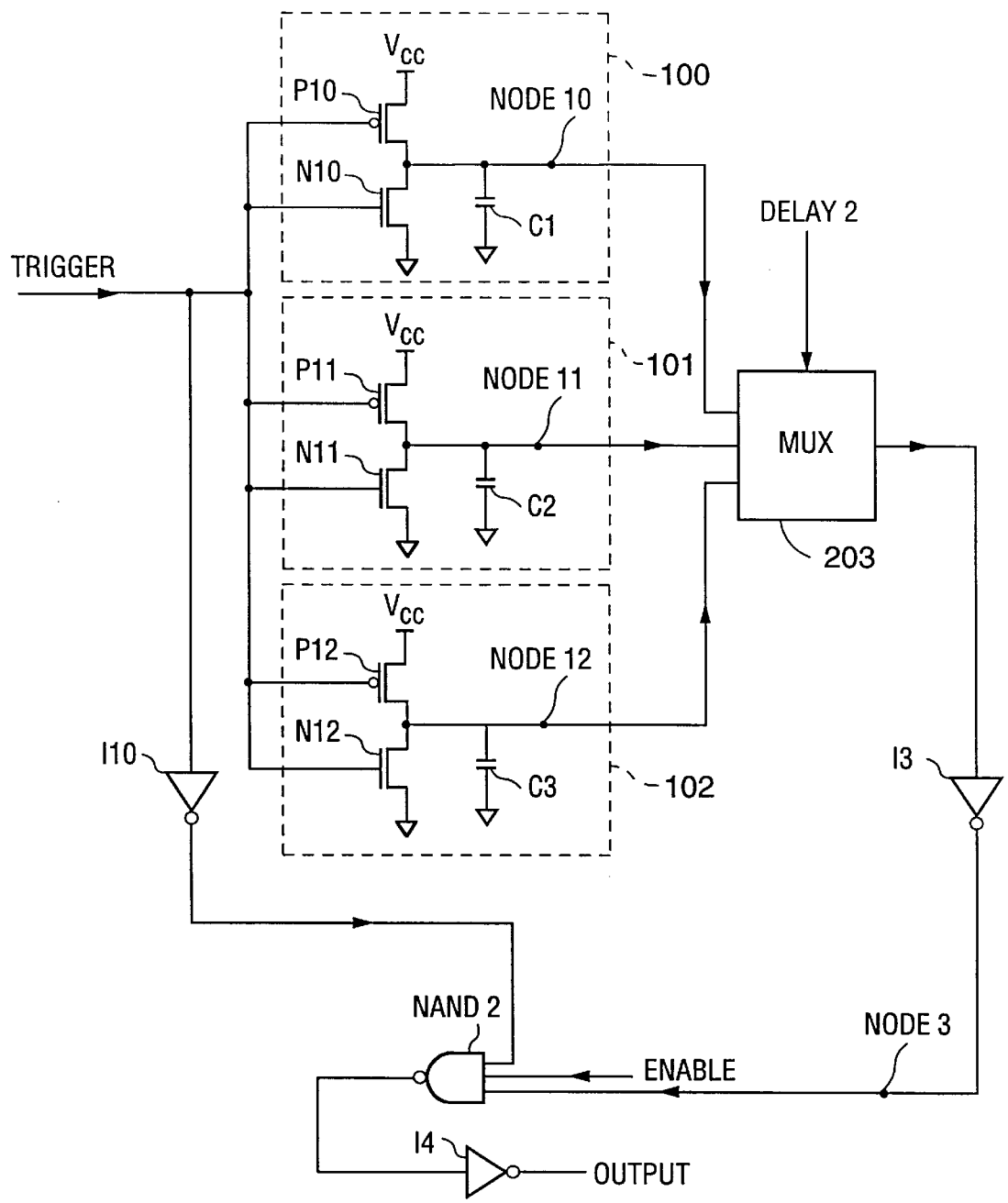
FIG. 8 is a schematic diagram of a third embodiment of the inventive one-shot circuit.

The FIG. 8 circuit is enabled by assertion of the same sequence of values of the Trigger and Enable signals as is the FIG. 7 (or FIG. 4) circuit. When the FIG. 8 circuit is enabled (and high levels of Trigger and Enable are asserted thereto), the Output signal (asserted at the output of inverter I4) has a low level. The Output signal (the output of inverter I4) undergoes a rapid low-to-high transition when the FIG. 8 circuit is triggered (by a high-to-low transition of the "Trigger" signal at a time when the "Enable" signal has a high level). In response to a high-to-low transition of the "Trigger" signal, the selected one of branches 100, 101, and 102 functions as a delay stage to cause a delayed high-to-low transition at the output of inverter I3, thus forcing a delayed high-to-low transition of the Output signal. The delayed high-to-low transition occurs at the output of I3 (and thus at the output of I4) after a delay period of duration determined by the control signal "Delay2."

Branch 100 responds as follows to the signal "Trigger." Assertion of Trigger with a high level switches on transistor N10 to allow capacitor C1 to discharge to ground through N10, and forcing Node 10 to go low when C1 has discharged sufficiently. In response to Node 10 going low (assuming Delay2 has caused circuit 203 to select the output of branch 100), the output of I3 goes high. Since the output of I3 (Node 3) is connected to the third input of NAND2, when C1 has discharged sufficiently so that Node 3 is high, the third input of NAND2 is held at a high level. Then, branch 100 responds as follows to being triggered by a high-to-low transition of Trigger (the output of I10 rapidly goes high in response to such transition, causing the output of NAND2 rapidly to go low and the "Output" signal rapidly to undergo a sharp low-to-high transition). In response to being triggered by a high-to-low transition of Trigger, transistor N10 switches off and transistor P10 switches on. As a result, supply voltage Vcc charges capacitor C1 through transistor P10. After a first delay (determined by the impedance of P10), C1 charges sufficiently so that Node 10 goes high. In response to Node 10 going high after the first delay (assuming Delay2 has caused circuit 203 to select the output of branch 100), the output of I3 goes low, causing the output of NAND2 to go high, thus causing Output to go low.

Branch 101 responds as follows to the signal "Trigger." Assertion of Trigger with a high level switches on transistor N11 to allow capacitor C2 to discharge to ground through N11, and forcing Node 11 to go low when C2 has discharged sufficiently. In response to Node 11 going low (assuming Delay2 has caused circuit 203 to select the output of branch 101), the output of I3 (Node 3) goes high. Thus, when C2 has discharged sufficiently so that Node 3 is high, the third input of NAND2 is held at a high level. Once this state has been reached, branch 101 responds as follows to being triggered by a high-to-low transition of Trigger (it should be recalled that the output of I10 rapidly goes high in response to such transition, causing the output of NAND2 rapidly to go low and the "Output" signal rapidly to undergo a sharp low-to-high transition). In response to being triggered by a high-to-low transition of Trigger, transistor N11 switches off and transistor P11 switches on. As a result, supply voltage Vcc charges capacitor C2 through transistor P11. After a second delay (determined by the impedance of P11), C2 charges sufficiently so that Node 11 goes high. In response to Node 11 going high after the second delay (assuming Delay2 has caused circuit 203 to select the output of branch 101), the output of I3 goes low, causing the output of NAND2 to go high, thus causing Output to go low.

Branch 102 responds as follows to the signal "Trigger." Assertion of Trigger with a high level switches on transistor N12 to allow capacitor C3 to discharge to ground through N12, and forcing Node 12 to go low when C3 has discharged sufficiently. In response to Node 12 going low (assuming Delay2 has caused circuit 203 to select the output of branch 102), the output of I3 (Node 3) goes high. Thus, when C3 has discharged sufficiently so that Node 3 is high, the third input of NAND2 is held at a high level. Once this state has been reached, branch 102 responds as follows to being triggered by a high-to-low transition of Trigger (it should be recalled that the output of I10 rapidly goes high in response to such transition, causing the output of NAND2 rapidly to go low and the "Output" signal rapidly to undergo a sharp low-to-high transition). In response to being triggered by a high-to-low transition of Trigger, transistor N12 switches off and transistor P12 switches on. As a result, supply voltage Vcc charges capacitor C3 through transistor P12. After a third delay (determined by the impedance of P12), C3 charges sufficiently so that Node 12 goes high. In response to Node 12 going high after the third delay (assuming Delay2 has caused circuit 203 to select the output of branch 102), the output of I3 goes low, causing the output of NAND2 to go high, thus causing Output to go low.

The impedances of P10, P11 and P12 (and the capacitances of C1, C2, and C3) are chosen so that the first, second, and third delays are different. In some embodiments, the impedances of P10, P11, and P12 are identical, and no two of the capacitances of C1, C2, and C3 are identical. In other embodiments, the capacitances of C1, C2, and C3 are identical, and no two of the impedances of P10, P11, and P12 are identical.

In variations on the FIG. 8 embodiment, each of the delay branches consists of a different capacitor only (and does not include transistors) and all the delay branches shares the same charging/discharging transistor circuitry (e.g., the circuit consisting of transistors N10 and P10 connected as shown). Each capacitor has a different capacitance. A multiplexer or other switch selectively couples a different one of the capacitors to the charging/discharging transistor circuitry, in response to a control signal (e.g., above-mentioned control signal Delay2).

Another embodiment of the one-shot circuit of the invention will be described with reference to FIG. 9. The FIG. 9 circuit (which can be substituted for the FIG. 4 circuit in most applications of the invention) is identical to that of FIG. 8, except in that the FIG. 9 circuit includes filter circuit 204 which is not included in the FIG. 8 circuit. Filter 204 functions to filter noise on the "Trigger" line as follows. After the FIG. 9 circuit has been enabled and Trigger has undergone a first high-to-low transition (so that the "Output" signal asserted at the output of inverter I4 has gone high rapidly), but before the capacitor charging delay period (determined by control signal Delay2) has elapsed (so that "Output" has not yet fallen back to its normally low level), filter 204 will prevent short duration increases of the level of "Trigger" (e.g., spikes due to noise) from affecting the level of "Output." Specifically, if Trigger goes high (for a short duration) with the FIG. 9 circuit in the described state, the "Filtered Trigger" signal output from filter 204 will remain low. Thus, the output of inverter I10 will remain high, and the other two inputs to gate NAND2 (Node 3 and the Enable signal) will also remain high, and thus the level of the output of NAND2 will remain low and the level of Output will remain high. Only after the delay period elapses will Node 3 fall to a low level, causing Output to fall to a low level. If inverter I10 is replaced by a short circuit (in FIG. 9), filter 204 can be implemented by a circuit identical to NAND1 and inverter I1 of FIG. 4 (connected as shown in FIG. 4, with the output of NAND2 coupled to one of the inputs of NAND1). As is apparent from the description of FIG. 4, NAND1 and inverter I1 function as a filter circuit in the FIG. 4 embodiment.

Figure 9:
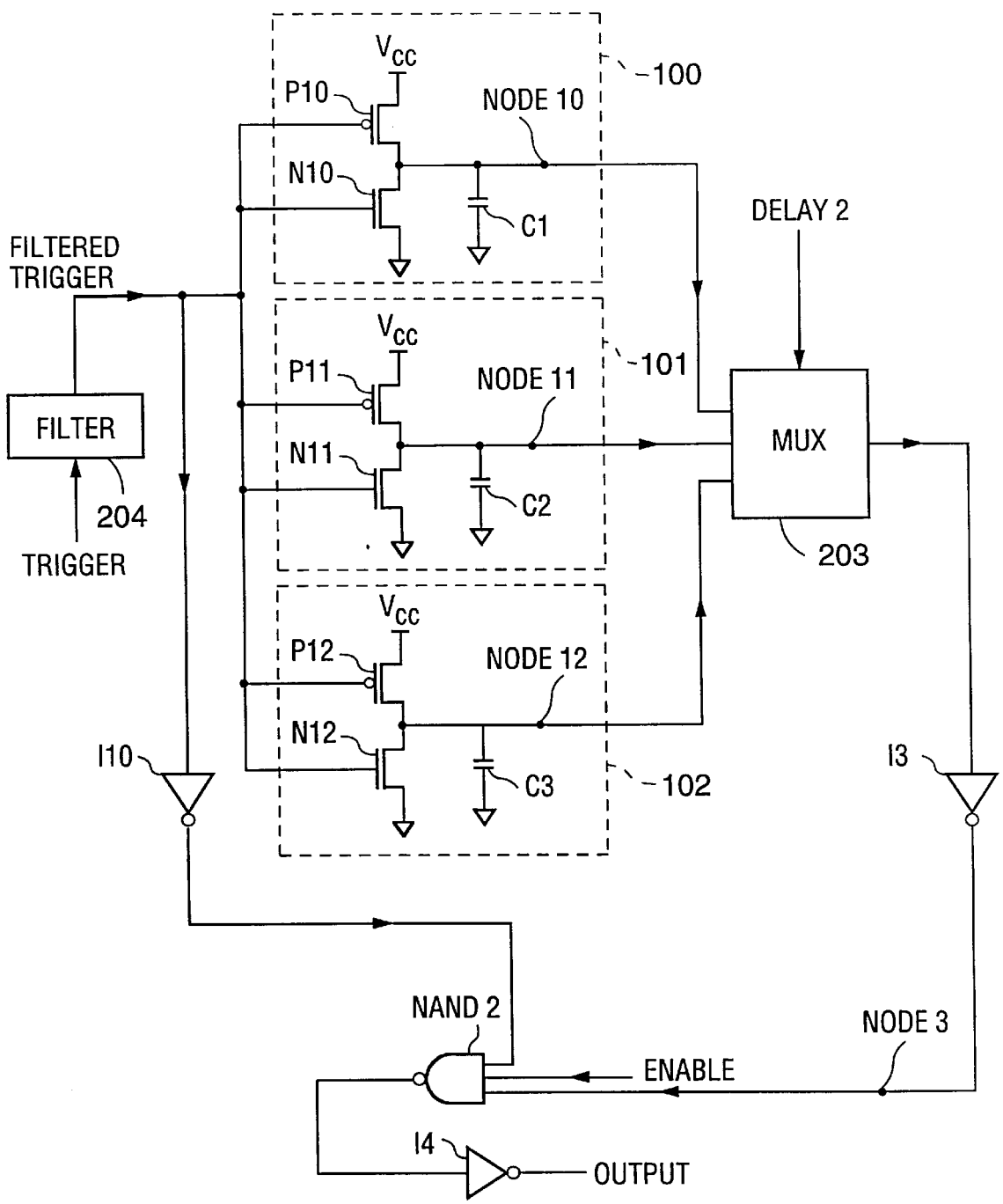
FIG. 9 is a schematic diagram of a fourth embodiment of the inventive one-shot circuit.

In the FIG. 9 circuit, each of branch circuits 100, 101, and 102 receives the Filtered Trigger signal (rather than the raw Trigger signal as in FIG. 8). At most instants of time during operation of the FIG. 9 circuit, the levels of the Filtered Trigger and Trigger signals will be substantially identical. Only during each short duration fluctuation (e.g., due to noise) of Trigger (after a desired "initial" transition of Trigger) is the level of Filtered Trigger substantially different from the level of Trigger (e.g., one is high while the other is low). Except as described in this paragraph and the preceding paragraph, the structure and operation of the FIG. 9 circuit is identical to that of FIG. 8, and the above description of the FIG. 8 circuit is applicable to FIG. 9 and will not be repeated with reference to FIG. 9.

In preferred embodiments of the invention, the inventive one-shot circuit includes a filter circuit (e.g., NAND1 and inverter I1 connected as shown in FIG. 4, or filter 204 of FIG. 9), having an input which receives a trigger signal (e.g., the "Trigger" signal of FIG. 4 or 9). The filter circuit does not suppress an initial (desired) transition of the trigger signal, but it does suppress at least some subsequent transitions of the trigger signal (e.g., short duration fluctuations of the level of the trigger signal, which occur after the initial transition of the trigger signal, and whose waveforms are high-going or low-going spikes), thus generating a filtered trigger signal. The filter circuit asserts the filtered trigger signal (sometimes denoted herein as a "switching" or "switch" signal) to the delay stage circuitry of the one-shot (e.g., to transistors P1, P2, and N1 of FIG. 4, or to transistors P10, P11, P12, N10, N11, and N12 in branch circuits 100, 101, and 102 of FIG. 9). Preferably, the one-shot circuit asserts the filtered trigger signal and the non-delayed transition of the one-shot circuit's output (e.g., the first transition of the Output signal of FIG. 4, which occurs at time T0 as shown in FIG. 6) substantially simultaneously, and the delay stage circuitry receives the filtered trigger signal and asserts a delayed trigger signal (with controllable delay after the first transition of the output signal) in response to the filtered trigger signal. The one-shot circuit asserts the second (delayed) transition of its output (e.g., the second transition of the Output signal of FIG. 4, which occurs at time T1 as shown in FIG. 6) in response to the delayed trigger signal.

Preferred embodiments of the invention have been described with reference to FIGS. 4–9. Although these embodiments have been described in some detail, it is contemplated that changes from any of these embodiments can be made without departing from the spirit and scope of the invention as defined by the appended claims.

What is claimed is:

1. A controllable one-shot circuit that generates a pulse, the circuit comprising a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

wherein the variable delay circuit includes:
a number of inverters with inputs that are controlled by the state of the trigger signal;
a number of capacitors, each capacitor coupled to an output of a respective one of the number of inverters;
a multiplexer, coupled to the output of each inverter so as to select the output of one of the inverters as the output of the variable delay circuit; and
wherein the capacitors and inverters are selected to provide a number of different delays.

2. A controllable one-shot circuit that generates a pulse the circuit comprising:

a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

wherein the variable delay circuit includes:
a number of inverters with inputs that are controlled by the state of the trigger signal;
a number of capacitors, each capacitor coupled to an output of a respective one of the number of inverters;
a multiplexer, coupled to the output of each inverter so as to select the output of one of the inverters as the output of the variable delay circuit;
wherein the capacitors and inverters are selected to provide a number of different delays; and
an inverter coupled between the output of the multiplexer and the first logic input of the logic circuit.

3. A controllable one-shot circuit that generates a pulse, the circuit comprising:

a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

wherein the variable delay circuit includes:
a number of inverters with inputs that are controlled by the state of the trigger signal;

a number of capacitors, each capacitor coupled to an output of a respective one of the number of inverters;

a multiplexer, coupled to the output of each inverter so as to select the output of one of the inverters as the output of the variable delay circuit;

wherein the capacitors and inverters are selected to provide a number of different delays; and a filter coupled to the input of the inverters so as to filter the trigger signal.

4. A controllable one-shot circuit that generates a pulse the circuit comprising:

a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

wherein the variable delay circuit includes:
first and second inverters;
first and second capacitors coupled to the inputs of the first and second inverters, respectively;
a circuit that charges the first capacitor coupled to the input of the first inverter;
a circuit that charges the second capacitor coupled between the first inverter and the second capacitor; and
wherein the circuits that charge the first and second capacitors each comprise a variable pull-up circuitry that is selected based on the control signal.

5. A controllable one-shot circuit that generates a pulse the circuit comprising:

a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

wherein the variable delay circuit includes:
first and second inverters;
first and second capacitors coupled to the inputs of the first and second inverters;
a circuit that charges the first capacitor coupled to the input of the first inverters, respectively;
a circuit that charges the second capacitor coupled between the first inverter and the second capacitor;
wherein the circuits that charge the first and second capacitors each comprise a variable pull-up circuit that is selected based on the control signal; and
wherein the variable pull-up circuit includes first and second p-channel transistors that are coupled in parallel with a gate of one of the p-channel transistors coupled to receive the control signal.

6. A controllable one-shot circuit that generates a pulse, the circuit comprising:

a variable delay circuit having an output and a control input;

a logic circuit coupled to the output of the variable delay circuit at a first logic a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

a filter that receives the trigger signal; and wherein the filter comprises a second logic circuit with a first input coupled to the trigger signal and a second input coupled to the output of the logic circuit.

7. A controllable one-shot circuit that generates a pulse, the circuit comprising:

a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal; and wherein the logic circuit comprises a NAND gate with a third input coupled to an enable signal.

8. A controllable one-shot circuit that generates a pulse, the circuit comprising: a variable delay circuit including:

a number of inverters with inputs that are responsive to the state of a trigger signal;

a number of capacitors, each capacitor coupled to an output of a respective one of the number of inverters;

a multiplexer, coupled to the output of each inverter and which receives a control signal so as to select the output of one of the inverters as the output of the variable delay circuit;

a NAND gate having a first input that is responsive to the output of the variable delay circuit and a second input that is responsive to the trigger signal; and wherein the state of the control signal provided to the multiplexer selects the duration of the pulse that is generated by the NAND gate and that is initiated by a transition in the state of the trigger signal.

9. The circuit of claim 8, wherein the capacitors and inverters are selected to provide a number of different delays.

10. The circuit of claim 8, and further including an inverter coupled to the output of the multiplexer and the first input of the NAND gate.

11. The circuit of claim 10, and further comprising a filter that receives the trigger signal.

12. The circuit of claim 8, wherein the multiplexer of the variable delay circuit includes a number of inputs to receive a multi-bit control signal.

13. A controllable one-shot circuit, comprising:

a variable delay circuit receiving a trigger signal and with a control signal input that sets the delay duration of the trigger signal;

a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

wherein the variable delay circuit includes:
 a number of inverters with inputs that are controlled by the state of the trigger signal;
 a number of capacitors, each capacitor coupled to an output of a respective one of the number of inverters;
 a multiplexer, coupled to the output of each inverter so as to select the output of one of the inverters as the output of the variable delay circuit; and
 wherein the capacitors and inverters are selected to provide a number of different delays.

14. A controllable one-shot circuit, comprising:

a variable delay circuit receiving a trigger signal and with a control signal input that sets the delay duration of the trigger signal;

a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

wherein the variable delay circuit includes:
 a number of inverters with inputs that are controlled by the state of the trigger signal;
 a number of capacitors, each capacitor coupled to an output of a respective one of the number of inverters;
 a multiplexer, coupled to the output of each inverter so as to select the output of one of the inverters as the output of the variable delay circuit;
 wherein the capacitors and inverters are selected to provide a number of different delays; and
 an inverter coupled between the output of the multiplexer and the second input of the logic circuit.

15. A controllable one-shot circuit, comprising:

a variable delay circuit receiving a trigger signal and with a control signal input that sets the delay duration of the trigger signal;

a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

wherein the variable delay circuit includes:
 a number of inverters with inputs that are controlled by the state of the trigger signal;
 a number of capacitors, each capacitor coupled to an output of a respective one of the number of inverters;
 a multiplexer, coupled to the output of each inverter so as to select the output of one of the inverters as the output of the variable delay circuit;
 wherein the capacitors and inverters are selected to provide a number of different delays; and
 a filter coupled to the input of the inverters so as to filter the trigger signal.

16. The circuit of claim 15, wherein the multiplexer of the variable delay circuit includes a number of inputs to receive a multi-bit control signal.

17. A controllable one-shot circuit, comprising:

a variable delay circuit receiving a trigger signal and with a control signal input that sets the delay duration of the trigger signal;

a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

wherein the variable delay circuit includes:
 first and second inverters;
 first and second capacitors coupled to the inputs of the first and second inverters, respectively;
 a circuit that charges the first capacitor coupled to the input of the first inverter;
 a circuit that charges the second capacitor coupled between the first inverter and the second capacitor; and
 wherein the circuits that charge the first and second capacitors each comprise a variable pull-up circuitry that is selected based on the control signal.

18. A controllable one-shot circuit, comprising:

a variable delay circuit receiving a trigger signal and with a control signal input that receives a control signal that sets the delay duration of the trigger signal;

a logic circuit with a first input responsive to a trigger signal and the second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

wherein the variable delay circuit includes:
 first and second inverters;
 first and second capacitors coupled to the inputs of the first and second inverters, respectively;
 a circuit that charges the first capacitor coupled to the input of the first inverter;
 a circuit that charges the second capacitor coupled between the first inverter and the second capacitor;
 wherein the circuits that charge the first and second capacitors each comprise a variable pull-up circuitry that is selected based on the control signal; and wherein the variable pull-up circuitry includes first and second p-channel transistors that are coupled in parallel with a gate of one of the p-channel transistors coupled to receive the control signal.

19. A controllable one-shot circuit, comprising:

a variable delay circuit receiving a trigger signal and with a control signal input that sets the delay duration of the trigger signal a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

a filter that receives the trigger signal; and wherein the filter comprises a second logic circuit with a first input coupled to the trigger signal and a second input coupled to the output of the logic circuit.

20. A controllable one-shot circuit, comprising:

a variable delay circuit receiving a trigger signal and with a control signal input that sets the delay duration of the delay trigger signal;

a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit; and wherein the logic circuit comprises a NAND gate with the first input responsive to the trigger signal, the second input responsive to the variable delay circuit, and a third input coupled to an enable signal.

21. A controllable one-shot circuit that generates a pulse, the circuit comprising:

a variable delay circuit that includes:
first and second inverters coupled in series, the first inverter responsive to a trigger signal;
first and second capacitors coupled to the inputs of the first and second inverters, respectively;
a circuit that charges the first capacitor coupled to the input of the first inverter;
a circuit that charges the second capacitor coupled between the first inverter and the second capacitor; and
wherein the circuits that charge the first and second capacitors each comprise a variable pull-up circuitry that is selected based on a control signal;

a logic gate with a first input responsive to an output of the variable delay circuit and a second input responsive to the trigger signal; and wherein the state of the control signal provided to the variable delay circuit selects the duration of the pulse that is generated by the logic circuit and that is initiated by a transition in the state of the trigger signal.

22. The circuit of claim 21, wherein the variable pull-up circuitry includes a number of p-channel transistors, with at least two transistors that are coupled in parallel.

23. The circuit of claim 21, and further including a filter coupled to the input of the inverters so as to filter the trigger signal.

24. The circuit of claim 21, wherein the circuits of the variable delay circuit includes a number of inputs to receive a multi-bit control signal.

25. The circuit of claim 21, wherein the variable pull-up circuit includes first and second p-channel transistors that are coupled in parallel with a gate of one of the p-channel transistors coupled to receive the control signal.

26. The circuit of claim 21, wherein the logic gate comprises a NAND gate with a third input coupled to an enable signal.

27. A controllable one-shot circuit that generates a pulse, the circuit comprising:

a variable delay circuit having an output and a control input;

a logic circuit coupled to the output of the variable delay circuit at a first logic input;

a second logic input of the logic circuit and another input of the variable delay circuit controlled by the state of a trigger signal;

wherein the state of a control signal provided to the control input of the variable delay circuit selects the duration of the pulse that is generated by the logic circuit and that is initiated by a transition in the state of the trigger signal;

wherein the variable delay circuit comprises a circuit with an adjustable time constant for charging a capacitor;

wherein the circuit with an adjustable time constant includes:

a number of p-channel transistors, with at least two transistors that are coupled in parallel;

wherein the gate of one of the p-channel transistors receives the control signal of the variable delay circuit;

a capacitor that is selectively charged through one or more of the p-channel transistors based on the state of the control signal; and wherein at least two additional transistors are coupled in series with the at least two transistors that are coupled in parallel.

28. The circuit of claim 15, and further comprising a filter that receives the trigger signal.

29. The controllable one-shot circuit of claim 27 wherein the gates of the at least two additional transistors are operatively coupled to the trigger signal.

30. A controllable one-shot circuit, comprising:

a variable delays circuit receiving a trigger signal and with a control signal input that receives a control signal that sets the delay duration of the trigger signal;

a logic circuit with a first input responsive to the trigger signal and a second input coupled to the output of the variable delay circuit;

an output of the one-shot circuit responsive to an output of the logic circuit;

wherein a transition in the trigger signal generates a leading edge of a pulse at the output of the one-shot circuit and the delayed application of the same transition in the trigger signal by the variable delay circuit to the second input of the logic circuit generates a trailing edge of the output of the one-shot circuit;

wherein the variable delay circuit comprises a circuit with an adjustable time constant for charging a capacitor;

wherein the circuit with an adjustable time constant includes:
- a number of p-channel transistors, with at least two transistors that are coupled in parallel;
- wherein the gate of one of the p-channel transistors receives the control signal of the variable delay circuit;
- a capacitor that is selectively charged through one or more of the p-channel transistors based on the state of the control signal; and wherein at least two additional transistors are coupled in series with the at least two transistors that are coupled in parallel.

31. The controllable one-shot circuit of claim 30 wherein the gates of the at least two additional are coupled in series are operatively coupled to the trigger signal.

32. The circuit of claim 30, and further comprising a filter that receives the trigger signal.

* * * * *

UNITED STATES PATENT AND TRADEMARK OFFICE
CERTIFICATE OF CORRECTION

PATENT NO. : 5,959,485  
DATED : September 28, 1999  
INVENTOR(S) : Rohparvar

Page 1 of 1

It is certified that error appears in the above-identified patent and that said Letters Patent is hereby corrected as shown below:

Column 20,  
Line 23, insert -- , -- after "pulse".

Column 21,  
Line 10, insert -- , -- after "pulse".

Column 22,  
Line 4, insert -- input; -- after "logic".

Column 24,  
Line 44, delete "a trigger" and insert -- the trigger --, therefor.

Column 26,  
Line 45, delete "15" and insert -- 27 --, therefor.  
Line 61, delete "delays" and insert -- delay --, therefor.

Column 28,  
Line 5, delete "are coupled in services" and insert -- transistors --, therefor.

Signed and Sealed this

Eighteenth Day of September, 2001

*Attest:*

*Attesting Officer*

NICHOLAS P. GODICI  
*Acting Director of the United States Patent and Trademark Office*